United States Patent
Chang et al.

(10) Patent No.: US 8,891,299 B2
(45) Date of Patent: Nov. 18, 2014

(54) MOSFET HAVING MEMORY CHARACTERISTICS

(75) Inventors: Ting-Chang Chang, Kaohsiung (TW); Chih-Hao Dai, Kaohsiung (TW); Fu-Yen Jian, Kaohsiung (TW); Wen-Hung Lo, Bade (TW); Shih-Chieh Chang, Taipei (TW); Ying-Lang Wang, Tien-Chung Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/571,153

(22) Filed: Aug. 9, 2012

(65) Prior Publication Data

US 2014/0043899 A1    Feb. 13, 2014

(51) Int. Cl.
*G11C 11/34* (2006.01)
*H01L 29/788* (2006.01)
*H01L 29/792* (2006.01)
*H01L 21/28* (2006.01)
*G11C 11/56* (2006.01)
*G11C 16/04* (2006.01)
*G11C 16/10* (2006.01)

(52) U.S. Cl.
CPC ............ *G11C 16/10* (2013.01); *H01L 29/7887* (2013.01); *H01L 29/7923* (2013.01); *H01L 21/28273* (2013.01); *G11C 11/5621* (2013.01); *H01L 21/28282* (2013.01); *G11C 16/0475* (2013.01)

USPC ............ 365/185.03; 365/185.17; 365/185.22; 365/185.19

(58) Field of Classification Search
CPC ........... G11C 11/5642; G11C 11/5621; G11C 16/0483; G11C 2211/5621; G11C 16/10; G11C 16/30; G11C 16/12; G11C 11/5628
USPC ............. 365/185.18, 185.29, 185.02, 185.28, 365/185.17, 185.22
See application file for complete search history.

(56) References Cited

U.S. PATENT DOCUMENTS

| | | | |
|---|---|---|---|
| 6,219,276 B1 * | 4/2001 | Parker ...................... | 365/185.03 |
| 6,928,001 B2 * | 8/2005 | Avni et al. ................ | 365/185.22 |
| 7,170,785 B2 * | 1/2007 | Yeh .......................... | 365/185.17 |
| 7,692,961 B2 * | 4/2010 | Eitan et al. ............... | 365/185.02 |
| 2003/0185055 A1 * | 10/2003 | Yeh et al. ................. | 365/185.28 |

* cited by examiner

*Primary Examiner* — Vanthu Nguyen
*Assistant Examiner* — Ajay Ojha
(74) *Attorney, Agent, or Firm* — Haynes and Boone, LLP (57) ABSTRACT

A method for performing a programming operation to a first memory bit and a second memory bit of a device is described. The method includes applying a pulse train voltage to a metal gate of the device and grounding a substrate of the device. By floating/grounding a drain of the device and/or by floating/grounding the source of the device, the first memory and the second memory bit are programmed. The pulse train voltage includes 10 to 1000 pulses. One pulse includes a peak voltage and a base voltage. The peak voltage ranges from 0.5 V to 10 V. A duration of the peak voltage ranges from 1 nanosecond to 1 millisecond. The base voltage is 0 V. A duration of the base voltage ranges from 1 nanosecond to 1 millisecond.

16 Claims, 9 Drawing Sheets

MOSFET HAVING MEMORY CHARACTERISTICS

BACKGROUND

A typical flash memory device includes a memory array having a large number of memory cells arranged in blocks. Each of the memory cells includes a field effect transistor having a control gate and a floating gate. The floating gate holds a charge and is separated from source and drain regions in a substrate by an oxide. Each memory cell can be electrically charged by electrons injected onto the floating gate. The charge may be removed from the floating gate by an erase operation. The data in flash memory cells are thus determined by the presence or absence of charge in the floating gates.

It is a trend in memory devices to scale down the device size for packing density and cost. In a conventional flash memory structure, it is a challenge to shrink the word line length due to conflicting factors. For the flash memory device, defects can be created in tunneling oxide after repeat programming/erasing operations. Once a defect appears in tunneling oxide, all the charges will loss through the defect (stress-induced leakage current (SILC)) because floating gate is a continue conductance layer. The SILC causes a serious reliability problem, especially for a scaled device (thinner tunneling oxide).

Accordingly, what are needed are a method and a device that address the above issues.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
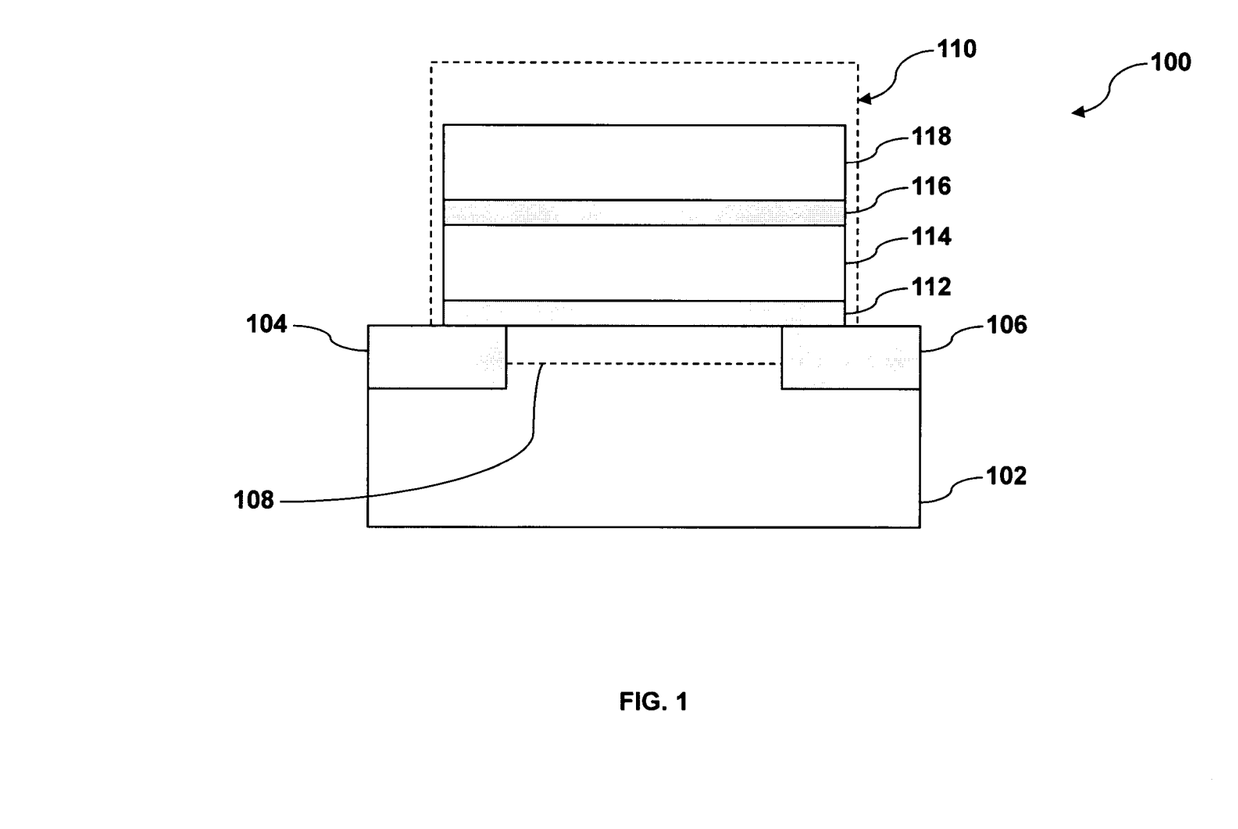
FIG. 1 is a diagrammatic cross-sectional side view of a flash memory device according to one or more embodiments of the present disclosure.

Referring now to FIG. 1, diagrammatic cross-sectional side view of a flash memory device 100 is illustrated according to one or more embodiments of the present disclosure. The device includes a substrate 102, a source 104, a drain 106, a conducting channel 108 and a gate stack 110. The gate stack 110 further includes a tunneling layer 112, a floating gate 114, a blocking layer 116, and a control gate 118. However, other configurations and inclusion or omission of devices may be possible. In the present disclosure, the flash memory device 100 is also referred to as a nonvolatile memory device. In the present embodiment, the substrate 102 includes a wafer and/or a plurality of conductive and non-conductive thin films. The wafer is a semiconductor substrate including silicon (in other words, a silicon wafer). Alternatively or additionally, the wafer includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). The plurality of conductive and non-conductive thin films may comprise an insulator or a conductive material. For example, the conductive material comprises a metal such as aluminum (Al), copper (Cu), tungsten (W), nickel (Ni), titanium (Ti), gold (Au), and platinum (Pt) and, thereof an alloy of the metals. The insulator material may include silicon oxide and silicon nitride. The substrate 102 further includes various doped features, such as n-type wells and/or p-type wells, formed by ion implantation or diffusion. The substrate 102 also includes various isolation features, such as shallow trench isolation (STI), formed by a process, such as a process including etching to form various trenches and then depositing to fill the trench with a dielectric material.

Continuing the present embodiment, the source 104 and the drain 106 are formed in the substrate 102. The source 104 and the drain 106 include an n-type dopant or a p-type dopant, formed by ion implantation or other suitable process. For example, the source 104 and the drain 106 are formed in a common ion implantation procedure. The channel 108 is formed in the substrate 102. The channel 108 includes various doped features, such as n-type channel or p-type channel. The channel 108 is electrically conductive and charges can flow between the source 104 and the drain 106 when a voltage is applied on the gate stack 110, and on the source 104 or the drain 106. The gate stack 110 is formed on the substrate 102. The gate stack 110 crosses over the channel 108, partially overlaps with portion of the source 104 at one side of the channel 108, and partially overlaps with portion of the drain 106 at another side of the channel 108. The gate stack 110 is formed by a process including depositing or growing to form multiple layer of films on the substrate 102, patterning a resist film deposited on the substrate 102, and etching the patterned resist film to form the gate stack.

In the present embodiments, the gate stack 110 includes the tunneling layer 112, the floating gate 114, the blocking layer 116, and the control gate 118. The tunneling layer 112 is formed on the substrate 102. One side of the tunneling layer 112 is configured to contact the source 104, and another side of the tunneling layer 106 is configured to contact the drain 104. In one embodiment, the tunneling layer 112 includes silicon oxide (SiO) formed by a thermal oxidation process or a chemical vapor deposition (CVD) process. The floating gate 114 is configured to be deposited on the tunneling layer 112 and separated from the substrate 102 by the tunneling layer 112. In an embodiment, the floating gate 114 includes a conductive material, such as doped polysilicon; or a non-conductive material, such as silicon nitride (SiN). The silicon oxide or silicon nitride is deposited by the thermal oxidation, a CVD process or other suitable process. The blocking layer 116 is formed on the floating gate 114, and is configured to separate the floating gate 114 from the control gate 118. The blocking layer 116 includes silicon oxide (SiO) or silicon oxide-nitride-oxide that may be formed by a thermal oxidation process or a chemical vapor deposition (CVD) process. The control gate 118 is deposited on the blocking layer 116, and is configured to apply a voltage to the gate stack 110 to form the conductive channel 108. The control gate 118 may include doped polysilicon, a metal or a metal alloy thereof.

As shown in FIG. 1, the tunnel layer 112 is formed between the substrate 102 and the floating gate 114. The tunnel layer 112 is configured to serve as a barrier to the floating gate 114, and electrons can be forced to tunnel into the floating gate 114 through the tunnel layer 112. The floating gate 114 is also separated from the conductive control gate 118 by the non-conductive blocking layer 116. The electrons can be forced into or out of the floating gate 114 through the tunnel layer 112 by applying a voltage between the control gate 118 and the source 104 or the drain 106. Therefore, the flash memory device 300 either has electrons in the floating gate 114, indicating a logical 1, or does not have any electrons in the floating gate 114, indicating a logical 0. When the voltage is removed, the floating gate 114 either retains the electrons if the electrons are tunneled into the floating gate 114, or has no electrons if the electrons are tunneled out of the floating gate 114. Thus, the flash memory device 100 has a memory function by retaining values after the voltage is removed.

As shown in FIG. 1, different flash memory devices are formed by changing the gate stack 110 of the device 100. For example, in an embodiment, the gate stack 110 includes silicon oxide as the tunneling layer 112, poly silicon as the floating gate 114, silicon oxide as the blocking layer 116, and polysilicon as control gate 118. In an embodiment, the flash memory device 100 is a typical conventional nonvolatile memory device. The polysilicon may cause a serious reliability issue because the continuous conductive polysilicon is surrounded by insulator layer tunneling oxide and blocking oxide. For example, a defect can be created in the silicon oxide of the tunneling layer 112 after repeatable programming or erasing operations. Once the defect appears in the silicon oxide of the tunneling layer 112, charges may be lost through the defect because the charges can move in/out the polysilicon of the floating gate 114. In some embodiments, the charge loss is also called a stress induced leakage current (SILC). Because of the stress induced leakage current, the scaling down for features of the device is limited.

In another example, if the gate stack 110 includes silicon oxide as the tunneling layer 112, silicon nitride as the floating gate 114, silicon oxide as the blocking layer 116, and polysilicon as the control gate 118, the flash memory device 100 is a SONOS (silicon-oxide-nitride-oxide-silicon) device. Because the electrons can not move in the floating gate 114 in the SONOS device, the SONOS device has two bit memory characteristic. The SONOS device also has soft-error immunity and better endurance. However the SONOS device needs a high voltage, such as +15 V or −15 V, for programming or erasing the memory. The high voltage for programming or erasing the memory in the SONOS device not only limits an application of the SONOS device, but also limits the scaling down for features of the SONOS device.

Figure 2:
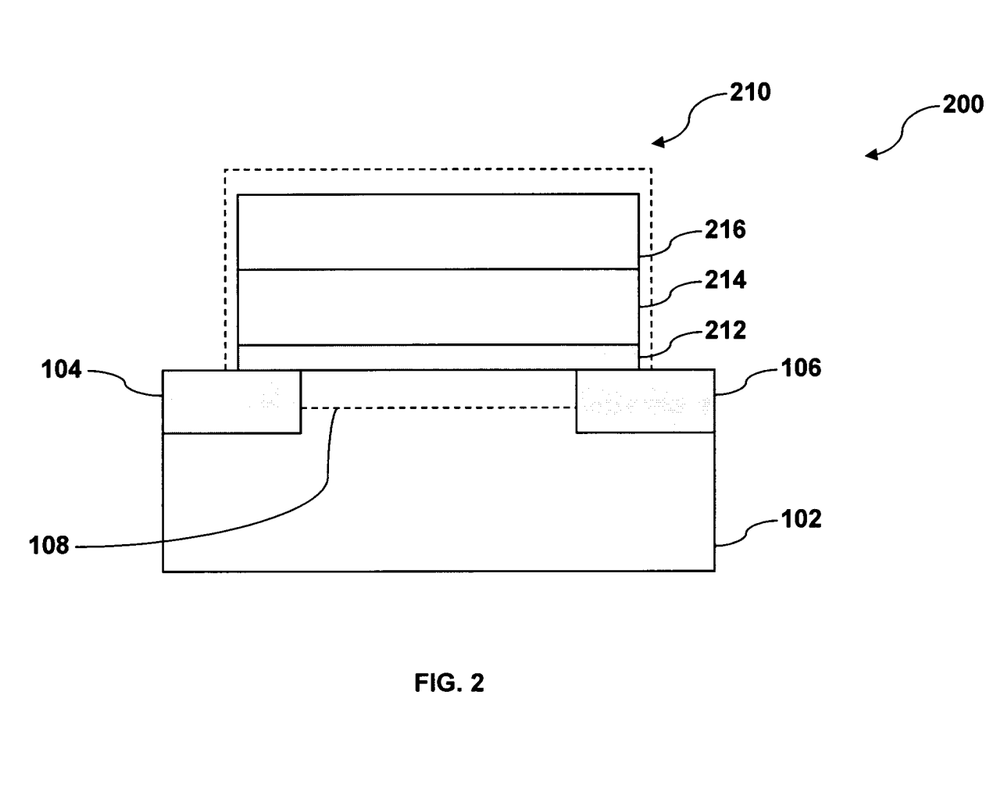
FIG. 2 is a diagrammatic cross-sectional side view of a device according to one or more embodiments of the present disclosure.

Referring now to FIG. 2, a diagrammatic cross-sectional side view of a device 200 is illustrated according to one or more embodiments of the present disclosure. The device 200 includes a substrate 102, a source 104, a drain 106, a conducting channel 108 and a gate stack 210. The gate stack 210 further includes an interfacial layer 212, a dielectric layer 214 and a metal gate 216. However, other configurations and inclusion or omission of devices may be possible. In foregoing discussion of the present disclosure, the substrate 102, the source 104, the drain 106, and the conducting channel 108 are described. The gate stack 210 is formed on the substrate 102. The gate stack 210 crosses over the channel 108, partially overlaps with portion of the source 104 at one side of the channel 108, and partially overlaps with portion of the drain 106 at another side of the channel 108. The gate stack 210 is formed by a process including depositing or growing to form multiple layer of films on the substrate 102, patterning a resist film deposited on the substrate 102, and etching the patterned resist film to form the gate stack.

The gate stack 210 may include the interfacial layer 212, the dielectric layer 214, and the metal gate 216. The interfacial layer 212 is deposited on the substrate 102. One side of the interfacial layer 212 is configured contact the source 104, and another side of the interfacial layer 212 is configured to contact the drain 106. In one embodiment, the interfacial layer 212 includes silicon oxide (SiO) formed by a thermal oxidation process or a chemical vapor deposition (CVD) process. The dielectric layer 214 is configured to be disposed on the interfacial layer 212 and separated from the substrate 102 by interfacial layer 212. The dielectric layer 214 may include a metal oxide (MOx), a metal silicon oxide (MSixOy) or a metal oxide nitride (MOxNy) with a dielectric constant (k) greater than 3.9. In an embodiment, the metal includes hafnium (Hf), zirconium (Zr), titanium (Ti), aluminum (Al), calcium (Ca), yttrium (Y), strontium (Sr), lanthanum (La), lutetium (Lu), barium (Ba), magnesium (Mg), germanium (Ge) or other suitable metal. The metal oxide or the metal silicon oxide may include $HfO_2$, $HfSiO_4$, $ZrO_2$, $ZrSiO_4$, HfZrO, $TiO_2$, $Ta_2O_5$, $Al_2O_3$, CaO, $Y_2O_3$, SrO, $La_2O_5$, $Lu_2O_3$, MgO, GeO or other suitable metal oxide, metal silicon oxide, or metal oxide nitride with the dielectric constant (k) greater than 3.9. The metal gate 216 is configured to be deposited on the dielectric layer 214. The metal gate 216 may include polysilicon, a metal or a metal alloy thereof, or a metal nitride compound, such as HfON.

In the foregoing discussion, in the device 200, various layers, such as the interfacial layer, dielectric layer and the metal layer, may be deposited by a physical vapor deposition (PVD) process such as evaporation and DC magnetron sputtering, a plating process such as electrode-less plating or electroplating, a chemical vapor deposition (CVD) process such as atmospheric pressure CVD (APCVD), a low pressure CVD (LPCVD), a plasma enhanced CVD (PECVD), or a high density plasma CVD (HDP CVD), an ion beam deposition, spin-on coating, a metal-organic decomposition (MOD), an atomic layer deposition (ALD) process and/or other suitable methods. The patterning process may include depositing a resist film on the substrate, exposing the resist film deposited on the substrate by an optical lithography tool or an electron beam writer, and developing the exposed resist film to form a resist pattern for etching process. The etching process may include dry (plasma) etching, wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

As shown in FIG. 2, the device 200 belongs to a metal oxide semiconductor field effect transistor (MOSFET) device. The MOSFET device is applied in logical circuit. Advantages of the MOSFET device are low electricity consumption, scaled down feature size, and high density of the circuit. However because there is no blocking layer between the dielectric layer 214 and the metal gate 216, the MOSFET device does not have a capability for memorizing the data.

Figure 3:
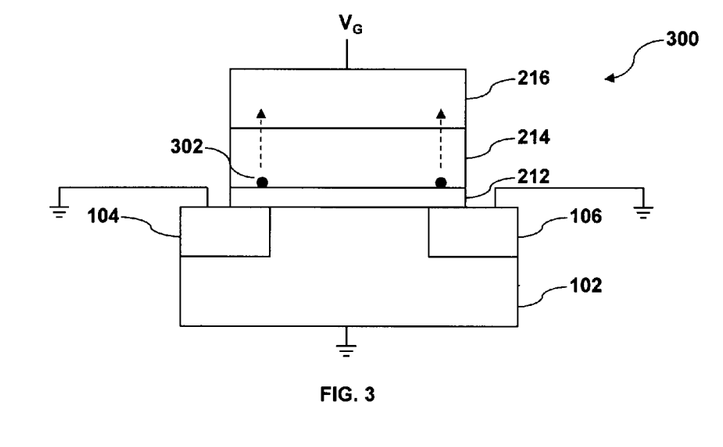
FIG. 3 is a diagram of a method 300 by applying a voltage on a device according to one or more embodiments of the present disclosure.
Figure 4:
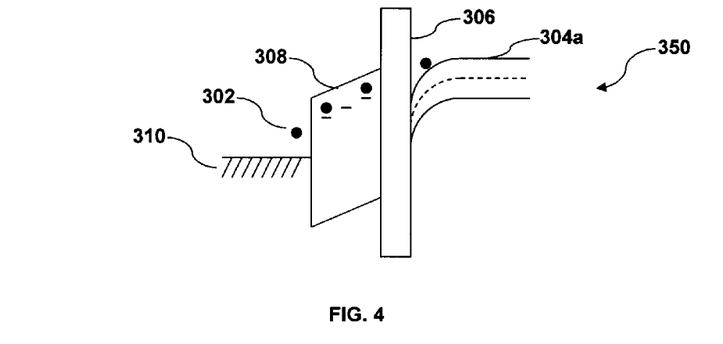
FIG. 4 is an energy band diagram of a device when applying a voltage on the device according to one or more embodiments of the present disclosure.

FIG. 3 is a diagram of a method 300 by applying a voltage on the device 200, and FIG. 4 is an energy band diagram 350 when applying the voltage on the device 200, according to one or more embodiments of the present disclosure. The energy band diagram 350 includes a source/drain energy band 304a (cut from the source or the drain) or a substrate energy band gap 304b (cut from the channel), an interfacial layer energy band 306, a dielectric layer energy band 308, and a metal gate energy band 310. In one embodiment, for example, the interfacial layer 212 is $SiO_2$, and the dielectric layer 214 is $HfO_2$. When a positive voltage, such as +1.5 V, is applied to the metal gate 216; and both source 104 and drain 106 are grounded as shown in FIG. 3; electrons 302 in the channel or source/drain energy band 304 are tunneled across the interfacial layer energy band 306 and into the dielectric layer energy band 308. Because there is no blocking layer between the dielectric layer energy band 308 and the metal gate energy band 310, the electrons 302 may fall into the metal gate band 310. In an embodiment, the electrons 302 can not stay in the dielectric layer 214; therefore the device 200 may not have the capability of memorizing the data by the method 300.

Figure 5:
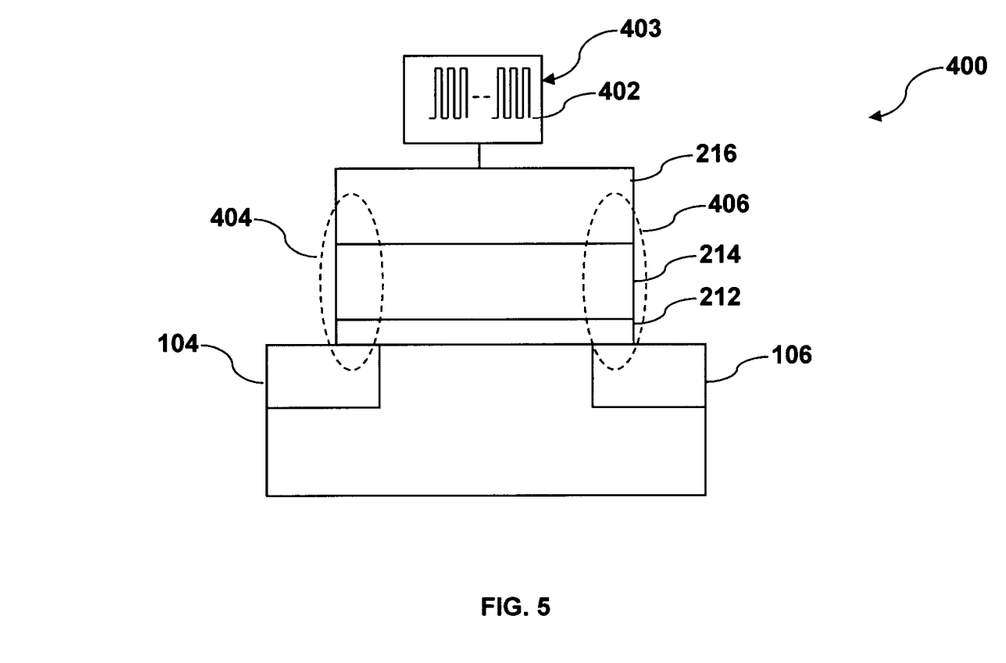
FIG. 5 is a diagram of a method 400 by applying a pulse train voltage to a device for benefiting one or more embodiments of the present disclosure.

Referring now to FIG. 5, a diagram of a method 400 including applying a pulse train voltage 402 on the device 200 is illustrated implementing one or more embodiments of the present disclosure. The pulse train voltage 402 is provided by a pulse train voltage supplier 403. The pulse train voltage supplier 403 is connected to the metal gate 216 of the device 200. The method 400 includes applying the pulse train voltage 402 to the metal gate 216 of the device 200, and tunneling the electrons 302 from the source 104 and/or the drain 106 into a first memory bit 404 and/or a second memory bit 406 in the dielectric layer 214. The pulse train voltage 402 includes a plurality of repeatable pulses. The pulse train voltage may include between approximately 10 to 1000 pulses. One pulse includes a peak voltage and a base voltage. For example, the peak voltage changes from 0.5 to 10 V, and the base voltage is 0 V. A duration for each peak or each base voltage may be between approximately 1 nanosecond (ns) and approximately 1 millisecond (ms).

Figure 6:
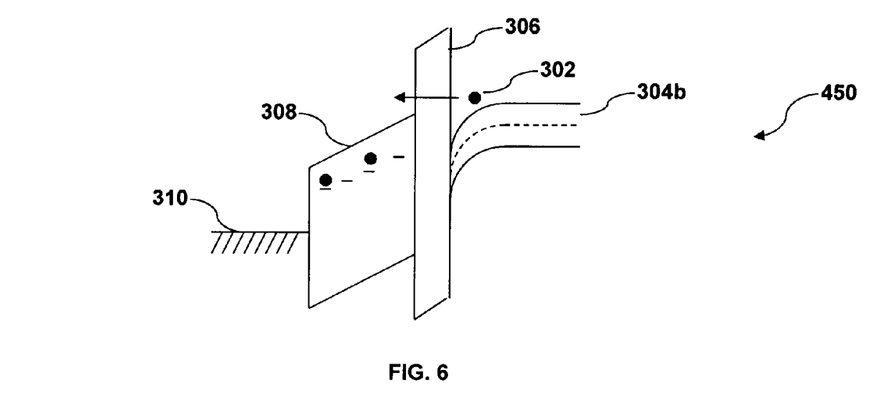
FIGS. 6-7 are energy band diagrams cut from cut a channel when a pulse train voltage is applied to a device according to one or more embodiments of the present disclosure.
Figure 7:
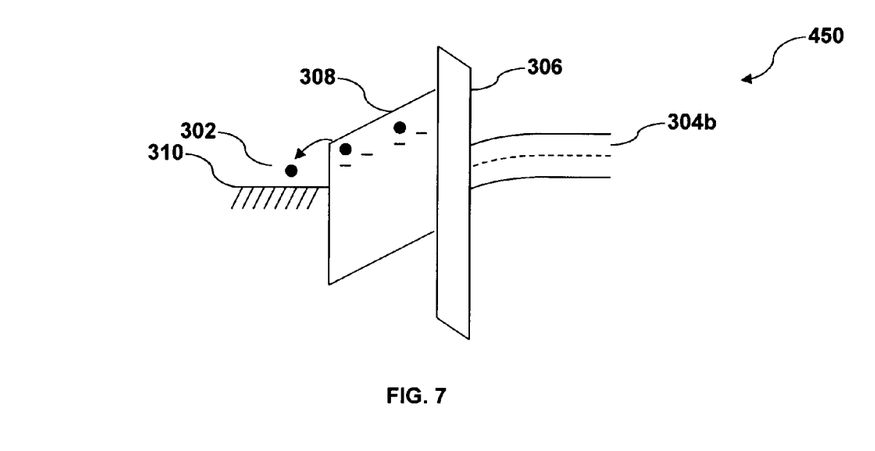

Referring now to FIGS. 6-7, energy band diagrams 450 are illustrated. The energy band diagrams 450 may be provided by applying the pulse train voltage 402 to the device 200 using the method 400 as shown in FIG. 5. As shown in FIG. 6, the energy band 450 includes the substrate energy band 304b (cut from the channel), the interfacial layer energy band 306, the dielectric layer energy band 308, and the metal gate energy band 310. However, other configurations and inclusion or omission of the apparatus device may be possible As shown in FIG. 6, when the pulse train voltage 402 is at an on state, indicating the peak voltage of the pulse train voltage 402, the electrons 302 can be injected into the dielectric energy band 308 and captured in a shallow trap of the dielectric energy band 308. When the first pulse train voltage 402 is at an off state, indicating the base voltage of the first pulse train voltage 402, the built-in electronic field established by a work function difference between the metal gate 216 and the substrate 102 forces the trapped electrons 302 to migrate toward the metal gate 216, for example, by Poole-Frenkel emission as shown in FIG. 7. This same electrical field direction during on state and off state of the pulse train voltage 402 continuously forces the electrons 302 captured in the shallow trap of the dielectric energy band 308 toward the metal gate 216. Therefore, few electrons 302 can be captured in a deep trap of the dielectric energy band above the channel region. This is also the reason why the electron trapping phenomenon may not be observed in the constant electrical field under static bias stress.

Figures 8, 9:
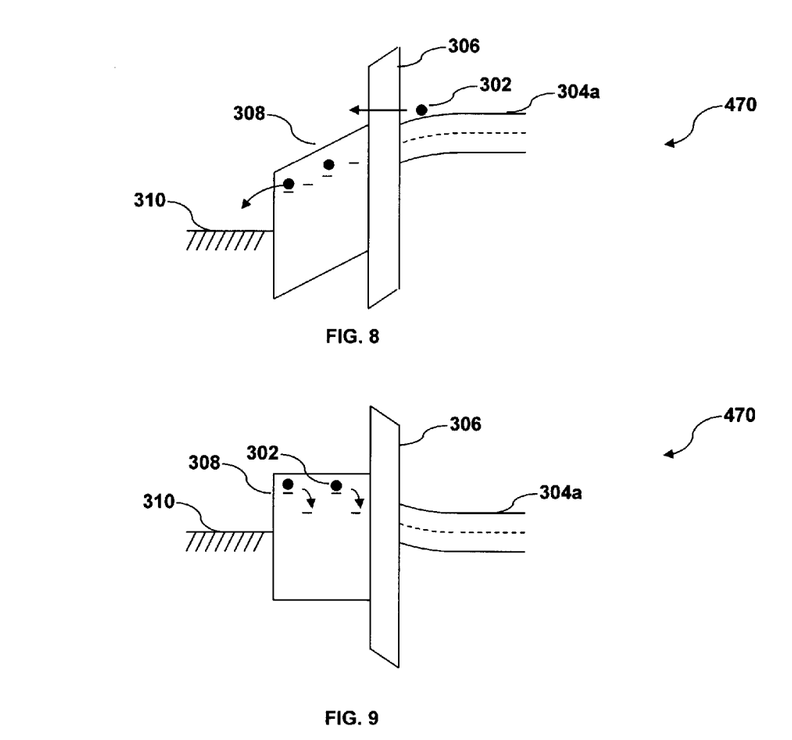
FIGS. 8-9 are energy band diagrams cut from cut a source/drain when a pulse train voltage is applied to a device according to one or more embodiments of the present disclosure.

Referring now to FIGS. 8-9, energy band diagrams 470 are illustrated. The energy band diagrams 470 may be provided by applying the pulse voltage 402 to the device 200 using the method 400 as shown in FIG. 5. As shown in FIG. 8, the energy band 470 includes the source/drain energy band 304a (cut from the source or the drain), the interfacial layer energy band 306, the dielectric layer energy band 308, and the metal gate energy band 310. However, other configurations and inclusion or omission of the apparatus device may be possible As shown in FIG. 8, when the first pulse train voltage 402 is at an on state, indicating the peak voltage of the pulse train voltage 402, the electrons 302 are tunneled from the source/drain band 304a into the dielectric layer band 308 and captured by the shallow trap of the dielectric band 308 by the pulse train voltage 402 being at the on state. When the pulse train voltage 402 is at an off state, indicating the base voltage of the pulse train 402, because of the positive value of work function difference between the metal gate and the source/drain, a contrary direction of electrical field exists and the electrical field prompts the electron 302 to migrate toward to the source/drain as shown in FIG. 9. The different electrical field directions between on and off states of the pulse train voltage 402 may not allow the electrons 302 captured in the shallow trap to have sufficient time to escape from the dielectric layer, and thus may increase a possibility of the electrons 302 being captured in the deep trap of the dielectric layer near the source/drain. Thus, the device 200 may have a two bit memory characteristic using the method 400 as shown in FIG. 5. The method 400 may take advantage of aspects of the MOSFET device, such as low programming/erasing voltage and high memory density. In an embodiment, no additional specific manufacturing process may be necessary to provide memory characteristics to the device 200.

Referring now to FIGS. 10-13, diagrammatic cross-sectional side views of a method 500 for programming (writing) two memory bits of the device 200 by using the pulse train voltage 402 are illustrated according to one or more embodiments of the present disclosure. The method 500 includes writing the first memory bit 404 and the second memory bit 406 and providing the memory status of the two memory bits as 00, 01, 10 or 11 by using the pulse train voltage 402. In one embodiment, for example, the peak voltage of the pulse train voltage 402 is +1.5 V, and the base voltage of the first pulse train voltage 402 is 0 V. Additional steps can be provided before, during, and after the method 500, and some the steps described can be replaced, eliminated, or moved around for additional embodiments of the method 500.

Figure 10:
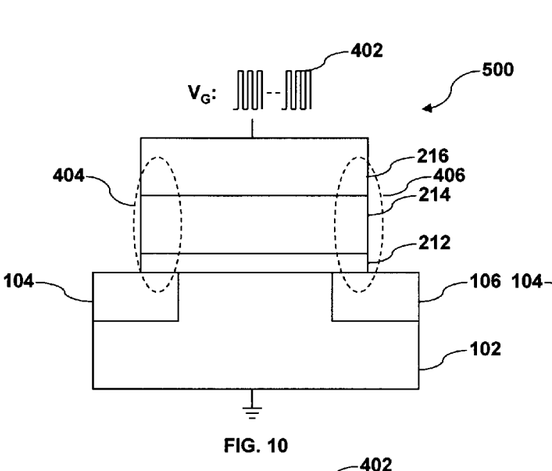
FIGS. 10-13 are diagrammatic cross-sectional side views of a method for programming (writing) two memory bits of a device by using a pulse train voltage for benefiting one or more embodiments of the present disclosure.

As shown in FIG. 10, a memory 00 status of the two memory bits is represented and provided according to one or more embodiments of the present disclosure. The pulse train voltage 402 is applied to the metal gate 216, the substrate 102 is grounded, and both the source 104 and the drain 106 are floated. No electrons 302 are forced into the first memory bit 404 or the second memory bit 406. A logical 00 is represented by the empty first bit 404 and the empty second bit 406.

Figure 11:
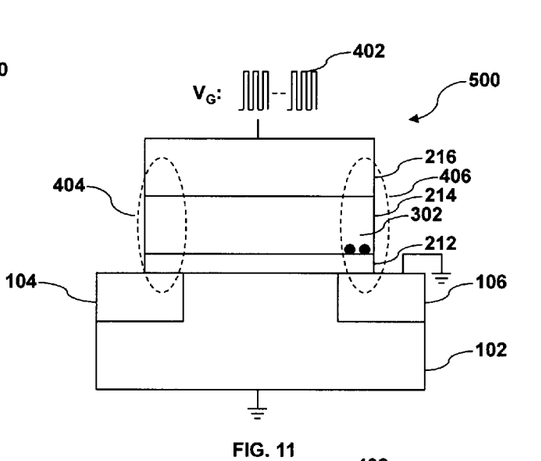

As shown in FIG. 11, a memory 01 status of the two memory bits is represented and provided according to one or more embodiments of the present disclosure. The pulse train voltage 402 is applied to the metal gate 216, the substrate 102 is grounded, the source 104 is floated, and the drain 106 is grounded. The electrons 302 are forced into the second memory bit 406 from the drain 106. The first bit 404 is empty, and the second bit 406 is occupied by the electrons 302. A logical 01 is represented by the empty first bit 404 and the occupied second bit 406.

Figure 12:
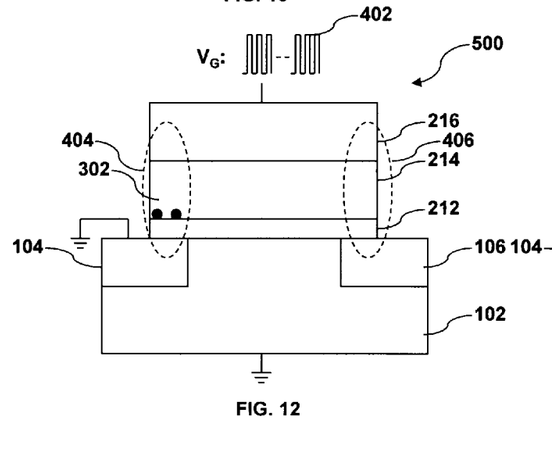

As shown in FIG. 12, a memory 10 status of the two memory bits is represented and provided according to one or more embodiments of the present disclosure. The pulse train voltage 402 is applied to the metal gate 216, the substrate 102 is grounded, the source 104 is grounded, and the drain 106 is floated. The electrons 302 are forced into the first memory bit 404 from the source 104. The first memory bit 404 is occupied by the electrons 302, and the second memory bit 406 is empty. A logical 10 is represented by the occupied first memory bit 404 and the empty second memory bit 406.

Figure 13:
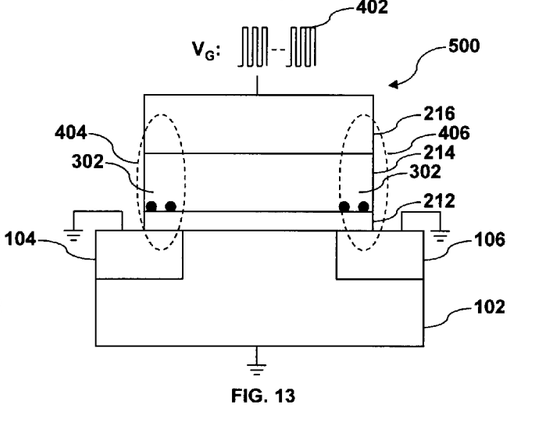

As shown in FIG. 13, a memory 11 status of the two memory bits is represented and provided according to one or more embodiments of the present disclosure. The first pulse train voltage 402 is applied to the metal gate 216, the substrate 102 is grounded, and both the source 104 and the drain 106 are grounded. The electrons 302 are forced into the first memory bit 404 from the source 104 and into the second memory bit 406 from the drain 106. Both the first memory bit 404 and the second bit 406 are occupied by the electrons 302. A logical 11 is represented by the occupied first memory bit 404 and the occupied second memory bit 406.

Figure 14:
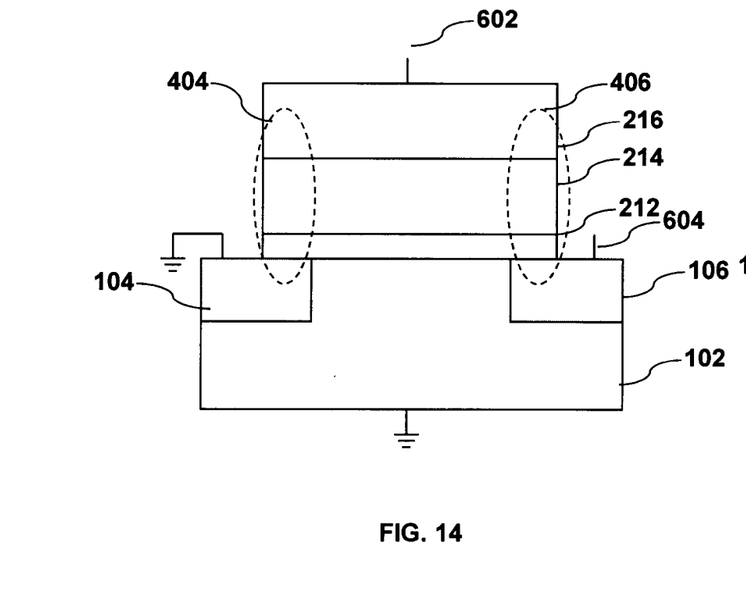
FIGS. 14-15 are diagrams of a method for reading two memory bits of a device for benefiting one or more embodiments of the present disclosure.
Figure 15:
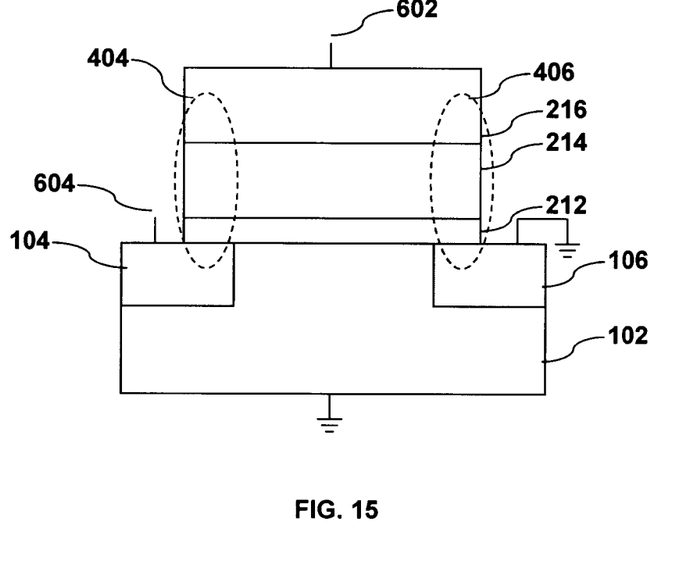

Referring now to FIGS. 14-15, diagrams of a method 600 for reading two memory bits on the device 200 are illustrated and provided according to one or more embodiments of the present disclosure. The method 600 includes reading the first memory bit 404 and the second memory bit 406 on the device 200 and providing the memory status of the two memory bits of the device by applying a first reading voltage 602 on the metal gate 216 and applying a second reading voltage 604 on the source 104 or the drain 106. Additional steps can be provided before, during, and after the method 600, and some the steps described can be replaced, eliminated, or moved around for additional embodiments of the method 600.

As shown in FIG. 14, in an embodiment, the first reading voltage 602 is applied to the metal gate 216 (e.g. Vg=+0.5~+0.8 V), the second reading voltage 604 is applied to the drain 106 (e.g. Vd=+1.0 V), and both the substrate 102 and the source 104 are grounded. A first current $I_D$ is read. The first memory bit 404 memory status can be determined by reading the first current $I_D$. As shown in FIG. 15, in an embodiment, the first reading voltage 602 is applied to the metal gate 216 (e.g. Vg=+0.5~+0.8 V), the second reading voltage is applied to the source 104 (e.g. Vs=+1.0 V), and both the substrate 102 and the drain 106 are grounded. A second current $I_S$ is read. The memory status of second memory bit 406 can be determined by reading the second current $I_S$.

For example, if the electrons are injected into second memory bit 406 (drain 106 side), the energy barrier in source side is not significant by applying the second reading voltage 604 to the drain 106 (e.g. Vd=+1.0 V) and grounding the source 104 to read the first current $I_D$ when the first reading voltage 602 is applied to the metal gate 216 (e.g. Vg=+0.5~+0.8 V). In this condition, the first current $I_D$ is the same after/before programming (writing). On the other hand, by applying the second reading voltage 604 to the source 104 (e.g. Vs=+1.0V) and grounding the drain 106 to read the second current $I_S$ when the first reading voltage 602 is applied to the metal gate 216 (e.g., Vg=+0.5~0.8V), the higher energy barrier in drain 106 side decreases the second current Is. Therefore, the memory status of the first memory bit 404 and the second memory bit 406 may be determined by reading the first current Id and the second current Is.

Figure 16:
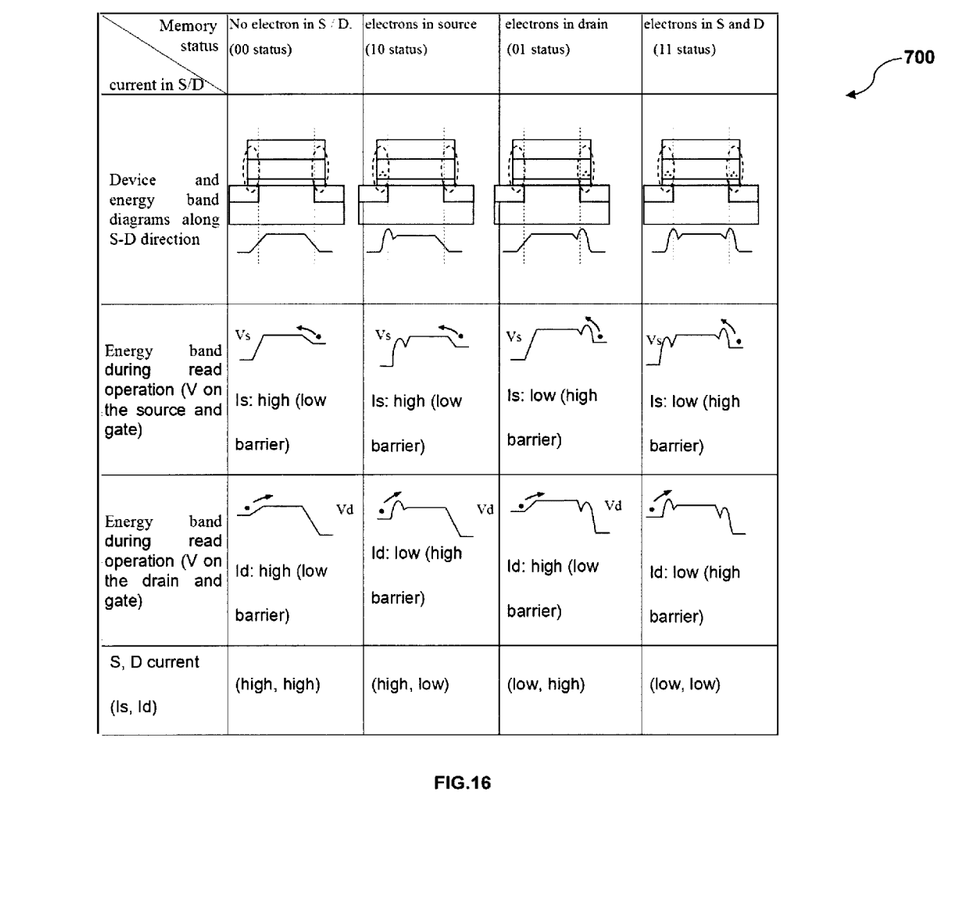
FIG. 16 is a summary table of reading memory status of a device for implementing one or more embodiments of the present disclosure.

Referring now to FIG. 16, illustrated is a summary table 700 of some embodiments of reading a memory status of a device, e.g., the device 200, which may implement one or more aspects of the present disclosure. The table 700 includes energy band diagrams, source current indications, and drain current indications when the memory of the referenced device is at each of 00, 10, 01, or 11 status respectively.

In a further embodiment, an erasing operation of the device 200 can be performed by using the Fowler-Nordheim tunneling (F-N tunneling) method or by using band to band hot hole (BTBHH) injection method. For example, in an embodiment, both the first memory bit 404 and the second bit memory bit 406 are erased by applying a first erasing voltage to the metal gate 216 and grounding both the source 104 and the drain 106 (Vg<0, Vs=0, Vd=0, i.e. erasing by F-N tunneling). In one example, the first memory bit 404 is erased by applying the first erasing voltage to the metal gate 206, and applying a second erasing voltage to the source 104, and grounding the drain 106 (Vg<0, Vs>0, Vd=0, i.e. erasing by BTBHH injection). In another example, the second memory bit 406 can be erased by applying the first erasing voltage to the metal gate 216, applying the second erasing voltage to the drain 106, and grounding the source 104 (Vg<0, Vs=0, Vd>0, i.e. erasing by BTBHH injection).

Thus, a method for performing a programming operation to a first memory bit and a second memory bit of a device is described. The method includes applying a pulse train voltage to a metal gate of the device and grounding a substrate of the device. Both source and drain of the device may be floated so that the first memory bit is programmed as 0 and the second memory bit may be programmed as 0. The first memory bit may be programmed as 1 and the second memory bit may be programmed as 0 by grounding the source of the device and floating the drain of the device. The first memory bit may be programmed as 0 and the second memory bit is programmed as 1 by floating the source of the device and grounding the drain. The first memory bit may be programmed as 1 and the second memory bit may be programmed as 1 by grounding the source and the drain of the device. The pulse train voltage may include 10 to 1000 pulses. One pulse may include a peak voltage and a base voltage. In an embodiment, the peak voltage ranges from 0.5 V to 10 V. A duration of the peak voltage may range from approximately 1 nanosecond to 1 millisecond. The base voltage may be 0 V. A duration of the base voltage may range from approximately 1 nanosecond to 1 millisecond.

In another embodiment, a method for performing a write operation of a first memory bit and a second memory bit of a device is provided. The method includes applying a pulse train voltage to a gate of the device and grounding a substrate of the device. A first configuration of the device is provided by floating a drain of the device. A first write operation is then performed on the device having the first configuration. The first write operation includes providing a first set of write data by floating a source of the device and thereafter, providing a second set of write data by grounding the source of the device. The first set of write data includes setting the first memory bit as a first status (e.g., a 0) and setting the second memory bit as a first status (e.g., a 0); the second set of write data includes setting the first memory bit as a second status (e.g., a 1) and setting the second memory bit as the first status (e.g., a 0). The method may further include providing a second configuration of the device by grounding the drain of the device. A second write operation is then performed on the device having the second configuration. The second write operation includes providing a third set of write data by floating the source of the device and thereafter, providing a fourth set of write data by grounding the source of the device. The third set of write data includes setting the first memory bit as a first status (e.g., a 0) and the second memory bit as a second status (e.g., a 1); the fourth set of write data includes setting the first memory bit as a second status (e.g., a 1) and setting the second memory bit as a second status (e.g., a 1). In other embodiments, the first status may be a 0 or a 1 and the second status the other one of a 0 and a 1.

In one embodiment, a method for performing a writing operation on a first memory bit and a second memory bit of a device is presented. The method includes applying a pulse train voltage to a gate of the device, grounding a substrate of the device, providing a first configuration of the device by floating a drain of the device, writing the device having the first configuration, providing a second configuration of the device by grounding the drain of the device, and writing the device having the second configuration. The pulse train voltage includes ranging from approximately 10 to approximate 1000 pulses, wherein one pulse includes a peak voltage and a base voltage. The peak voltage ranges from approximately 0.5 V to approximately 10 V with a duration ranging from approximately 1 nanosecond to approximately 1 millisecond. The base voltage is approximately 0 V with a duration ranging from approximately 1 nanosecond to approximately 1 millisecond. The method further includes reading operation on a first memory bit and a second memory bit of a device. The reading operation includes grounding a substrate of the device, applying a first reading voltage to a gate of the device, reading a first current by applying a second reading voltage to a drain of the device and grounding a source of the device, and reading a second current by applying the second reading voltage to the source of the device and grounding the drain of the device. The method further includes erasing at least one of the first memory bit and the second memory bit. The erasing includes erasing the first memory bit by applying a first erasing voltage to the gate of the device, applying a second erasing voltage to the source of the device, and grounding the drain of the device; and wherein the erasing includes erasing the second memory bit by applying the first erasing voltage to the gate of the device, applying the second erasing voltage to the drain of the device, and grounding the source of the device.

In another embodiment, a device for memorizing two bit memory is described. The device includes a substrate, a source formed in the substrate and configured to provide electrons in/out of a first memory bit, a drain formed in the substrate and configured to provide electrons in/out of a second memory bit, and a gate stack formed on the substrate and connected to a pulse voltage supplier. The gate stack crosses over a channel between the source and the drain, partially overlaps with portion of the source at one side of the channel, and partially overlaps with portion of the drain at another side of the channel. The pulse voltage supplier is configured to provide a pulse train voltage to program the two memory bits of the gate stack. In an embodiment, the gate stack includes an interfacial layer deposited on the substrate, a dielectric layer deposited on the interfacial layer, and a metal layer deposited on the dielectric layer. The interfacial layer may include silicon oxide. The dielectric layer may include a metal oxide (MOx), a metal silicon oxide (MSixOy) or a metal oxide nitride (MOxNy) with a dielectric constant (k) greater than 3.9, the metal M including hafnium (Hf), zirconium (Zr), titanium (Ti), aluminum (Al), calcium (Ca), yttrium (Y), strontium (Sr), lanthanum (La), lutetium (Lu), barium (Ba), magnesium (Mg), germanium (Ge) or other suitable metal. The metal layer includes polysilicon, a metal or a metal alloy thereof, or a metal nitride compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for performing a programming operation of a first memory bit and a second memory bit of a device, the method comprising:
   providing a first configuration of the device, the device including a metal-oxide-semiconductor device without a blocking layer, wherein the first configuration includes:
      applying a pulse train voltage to a gate of the device;
      grounding a substrate of the device; and
      floating a drain of the device;
   programming the device having the first configuration, wherein the programming the device includes using the pulse train voltage to apply different electric field directions timed such that electrons in shallow dielectric traps become captured in deep dielectric traps, and wherein the programming includes:
      programming the first memory bit as a 0 and programming the second memory bit as a 0 by floating a source of the device; and
      thereafter, programming the first memory bit as a 1 and programming the second memory bit as 0 by grounding the source of the device.

2. The method of claim 1, further comprising:
   providing a second configuration of the device, wherein the second configuration includes:
      applying the pulse train voltage to the gate of the device;
      grounding the substrate of the device; and
      grounding the drain of the device;

programming the device having the second configuration, wherein the programming includes programming the first memory bit as a 0 and programming the second memory bit as a 1 by floating the source of the device; and thereafter, programming the device having the second configuration, wherein the programming includes programming the first memory bit as a 1 and programming the second memory bit as a 1 by grounding the source of the device.

3. The method of claim 1, wherein the pulse train voltage includes between approximately 10 to approximately 1000 pulses, wherein one pulse includes a peak voltage and a base voltage.

4. The method of claim 3, wherein the peak voltage ranges from approximately 0.5 V to approximately 10 V.

5. The method of claim 3, wherein a duration of the peak voltage ranges from approximately 1 nanosecond to approximately 1 millisecond.

6. The method of claim 3, wherein the base voltage is approximately 0 V.

7. The method of claim 3, wherein a duration of the base voltage ranges from approximately 1 nanosecond to approximately 1 millisecond.

8. A method for performing a programming operation of a first memory bit and a second memory bit of a device, the method comprising:
   providing a first configuration of the device, wherein the first configuration includes:
      applying the pulse train voltage to the gate of the device;
      grounding the substrate of the device; and
      grounding the drain of the device;
   programming the device having the first configuration, wherein the programming the device includes using the pulse train voltage to apply different electric field directions timed such that electrons in shallow dielectric traps become captured in deep dielectric traps, and wherein the programming includes programming the first memory bit as a 0 and programming the second memory bit as a 1 by floating the source of the device; and
   thereafter, programming the device having a second configuration, wherein the programming includes programming the first memory bit as a 1 and programming the second memory bit as a 1 by grounding the source of the device.

9. The method of claim 8, wherein the pulse train voltage includes between approximately 10 to approximately 1000 pulses, wherein one pulse includes a peak voltage and a base voltage.

10. The method of claim 9, wherein the peak voltage ranges from approximately 0.5 V to approximately 10 V.

11. The method of claim 9, wherein a duration of the peak voltage ranges from approximately 1 nanosecond to approximately 1 millisecond.

12. The method of claim 9, wherein the base voltage is approximately 0 V.

13. The method of claim 9, wherein a duration of the base voltage ranges from approximately 1 nanosecond to approximately 1 millisecond.

14. The method of claim 8, wherein the device includes a metal-oxide-semiconductor device without a blocking layer.

15. A method for programming a two-bit device, the method comprising:
   providing a first sequence, including applying a pulse train voltage to a gate of the device and floating a drain of the device, wherein the device includes a metal-oxide-semiconductor device without a blocking layer;
   after providing the first sequence, programming the device, wherein the programming the device includes using the pulse train voltage to apply different electric field directions timed such that electrons in shallow dielectric traps become captured in deep dielectric traps, and further including:
      programming the first bit as a 0 and programming the second bit as a 0 by floating a source of the device; and
      thereafter, programming the first bit as a 1 and programming the second bit as 0 by grounding the source of the device.

16. The method of claim 15, further comprising:
   providing a second sequence, wherein the second sequence includes:
      applying the pulse train voltage to the gate of the device;
      grounding the substrate of the device; and
      grounding the drain of the device;
   after providing the second sequence, programming the device, including:
      programming the first bit as a 0 and programming the second bit as a 1 by floating the source of the device; and
      thereafter, programming the device having the second sequence, wherein the programming includes programming the first bit as a 1 and programming the second bit as a 1 by grounding the source of the device.

* * * * *